(12) United States Patent
Hackenschmied et al.

(10) Patent No.: US 9,097,810 B2
(45) Date of Patent: Aug. 4, 2015

(54) DIRECT RADIATION CONVERTER, RADIATION DETECTOR, MEDICAL APPARATUS AND METHOD FOR PRODUCING A DIRECT RADIATION CONVERTER

(75) Inventors: Peter Hackenschmied, Nürnberg (DE); Christian Schröter, Bamberg (DE); Matthias Strassburg, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 336 days.

(21) Appl. No.: 13/359,554

(22) Filed: Jan. 27, 2012

(65) Prior Publication Data

US 2012/0193739 A1 Aug. 2, 2012

(30) Foreign Application Priority Data

Feb. 1, 2011 (DE) .......................... 10 2011 003 454

(51) Int. Cl.
- *H01L 31/102* (2006.01)
- *G01T 1/24* (2006.01)
- *H01L 31/08* (2006.01)

(52) U.S. Cl.
CPC ................ *G01T 1/24* (2013.01); *H01L 31/085* (2013.01)

(58) Field of Classification Search
USPC .................................................. 257/428, 463
See application file for complete search history.

(56) References Cited

U.S. PATENT DOCUMENTS

| | | | | | |
|---|---|---|---|---|---|
| 2,858,275 | A | * | 10/1958 | Folberth | 252/62.3 GA |
| 3,249,473 | A | * | 5/1966 | Holonyak, Jr. | 117/100 |
| 3,415,989 | A | * | 12/1968 | Leventhal et al. | 250/361 R |
| 3,582,830 | A | * | 6/1971 | Pultorak et al. | 332/177 |
| 4,131,486 | A | * | 12/1978 | Brandhorst, Jr. | 136/255 |
| 4,142,200 | A | * | 2/1979 | Mizushima et al. | 257/438 |
| 4,155,785 | A | * | 5/1979 | Cuomo et al. | 438/58 |

(Continued)

FOREIGN PATENT DOCUMENTS

| | | |
|---|---|---|
| DE | 102008024539 B3 | 11/2009 |
| DE | 102009037463 A1 | 2/2011 |

(Continued)

OTHER PUBLICATIONS

John, Gallium Arsenide (GaAs Doping Process, Circuits Today, Aug. 2010, 4 pages.*

(Continued)

*Primary Examiner* — Earl Taylor
(74) *Attorney, Agent, or Firm* — Harness, Dickey & Pierce, P.L.C.

(57) ABSTRACT

A direct radiation converter is disclosed which includes a radiation detection material having an anode side and a cathode side in which the radiation detection material has a doping profile running in the anode-side to cathode-side direction. A radiation detector is further disclosed having such a direct radiation converter and having an anode array and a cathode array, and optionally having evaluation electronics for reading out a detector signal, as well as a medical apparatus having such a radiation detector. Also described is a method for producing a direct radiation converter which includes incorporating into a radiation detection material a doping profile running in the anode-side to cathode-side direction.

18 Claims, 2 Drawing Sheets

(56) References Cited

U.S. PATENT DOCUMENTS

| | | | |
|---|---|---|---|
| 4,160,985 A * | 7/1979 | Kamins et al. | 257/443 |
| 4,234,352 A * | 11/1980 | Swanson | 136/253 |
| 4,353,081 A * | 10/1982 | Allyn et al. | 257/191 |
| 4,885,620 A * | 12/1989 | Kemmer et al. | 257/428 |
| 5,391,882 A | 2/1995 | Rhiger | |
| 5,510,644 A | 4/1996 | Harris et al. | |
| 5,512,756 A * | 4/1996 | Bayer et al. | 250/370.13 |
| 5,680,073 A * | 10/1997 | Nathan et al. | 327/586 |
| 5,889,313 A * | 3/1999 | Parker | 257/429 |
| 6,043,495 A | 3/2000 | Verger et al. | |
| 6,248,990 B1 * | 6/2001 | Pyyhtia et al. | 250/208.1 |
| 6,278,119 B1 * | 8/2001 | Nikzad et al. | 250/371 |
| 6,403,963 B1 * | 6/2002 | Nikzad et al. | 250/370.01 |
| 6,455,858 B1 * | 9/2002 | Patt et al. | 250/370.14 |
| 6,683,360 B1 * | 1/2004 | Dierickx | 257/428 |
| 6,713,768 B2 * | 3/2004 | Iwanczyk et al. | 250/370.11 |
| 6,781,133 B2 * | 8/2004 | Karplus et al. | 250/370.1 |
| 6,933,503 B2 * | 8/2005 | Sipila et al. | 250/370.09 |
| 6,998,619 B2 * | 2/2006 | Karplus et al. | 250/370.1 |
| 7,115,878 B2 | 10/2006 | Ikeda et al. | |
| 7,391,028 B1 * | 6/2008 | Rubenstein | 250/370.08 |
| 7,491,948 B2 * | 2/2009 | Gordon et al. | 250/472.1 |
| 7,538,330 B2 * | 5/2009 | Nomura et al. | 250/370.11 |
| 7,723,693 B2 * | 5/2010 | Okada et al. | 250/370.01 |
| 7,737,410 B2 * | 6/2010 | Rubenstein | 250/370.08 |
| 7,816,653 B2 * | 10/2010 | Aurola | 250/370.14 |
| 7,893,405 B2 * | 2/2011 | Nagano et al. | 250/370.11 |
| 8,135,109 B2 * | 3/2012 | Hackenschmied et al. | 378/19 |
| 8,158,950 B2 * | 4/2012 | Rubenstein | 250/370.08 |
| 8,502,156 B2 * | 8/2013 | Hackenschmied et al. | 250/370.09 |
| 8,519,347 B2 * | 8/2013 | Kanatzidis et al. | 250/370.09 |
| 8,530,850 B2 * | 9/2013 | Spartiotis et al. | 250/370.13 |
| 8,586,936 B2 * | 11/2013 | Yang et al. | 250/370.13 |
| 2002/0014603 A1 * | 2/2002 | Nagli | 250/581 |
| 2002/0148967 A1 * | 10/2002 | Iwanczyk et al. | 250/370.11 |
| 2003/0080298 A1 * | 5/2003 | Karplus et al. | 250/370.1 |
| 2004/0007671 A1 * | 1/2004 | Sipila et al. | 250/370.01 |
| 2004/0094718 A1 * | 5/2004 | Fuchs et al. | 250/362 |
| 2004/0113087 A1 * | 6/2004 | Ikeda et al. | 250/370.09 |
| 2004/0232344 A1 * | 11/2004 | Karplus et al. | 250/370.1 |
| 2005/0236575 A1 * | 10/2005 | Petroz | 250/370.09 |
| 2005/0268841 A1 | 12/2005 | Lynn | |
| 2007/0131867 A1 * | 6/2007 | Okada et al. | 250/370.09 |
| 2008/0173822 A1 * | 7/2008 | Feltgen et al. | 250/370.01 |
| 2009/0045346 A1 * | 2/2009 | Von Kanel et al. | 250/370.09 |
| 2009/0046346 A1 | 2/2009 | Finlayson | |
| 2009/0114830 A1 * | 5/2009 | Rubenstein | 250/370.08 |
| 2009/0200479 A1 * | 8/2009 | Nomura et al. | 250/370.11 |
| 2010/0098210 A1 * | 4/2010 | Hackenschmied et al. | 378/19 |
| 2010/0117108 A1 * | 5/2010 | Gaebler et al. | 257/98 |
| 2010/0127182 A1 * | 5/2010 | Hackenschmied et al. | 250/370.09 |
| 2010/0133441 A1 * | 6/2010 | Aurola | 250/370.14 |
| 2010/0246758 A1 * | 9/2010 | Hackenschmied et al. | 378/19 |
| 2011/0049379 A1 * | 3/2011 | Moses | 250/390.01 |
| 2011/0186788 A1 | 8/2011 | Hackenschmied et al. | |
| 2011/0248370 A1 * | 10/2011 | Tsoi et al. | 257/437 |
| 2011/0272589 A1 * | 11/2011 | Yang et al. | 250/370.13 |
| 2012/0133009 A1 * | 5/2012 | Sasaki | 257/429 |
| 2012/0193739 A1 * | 8/2012 | Hackenschmied et al. | 257/428 |
| 2013/0022077 A1 * | 1/2013 | Harmon et al. | 374/178 |
| 2013/0049146 A1 * | 2/2013 | Dierre et al. | 257/428 |
| 2013/0256541 A1 * | 10/2013 | Engel et al. | 250/370.01 |

FOREIGN PATENT DOCUMENTS

| | | |
|---|---|---|
| DE | 102010006452 A1 | 8/2011 |
| EP | 1429156 A1 | 6/2004 |

OTHER PUBLICATIONS

Wolf and Tauber, Silicon Processing for the VLSI Era, vol. 1: Process Technology $2^{nd}$ edition, 2000, section 10.1-10.3, 31 pages.*

Alan Owens, A. Peacock, "Compound semiconductor radiation detectors", Nuclear Instruments and Methods in Physics Research A 531 (2004), pp. 18-37; Others.

Office Action for corresponding Chinese patent application No. 2012100221804 dated Aug. 21, 2014 with English translation.

* cited by examiner

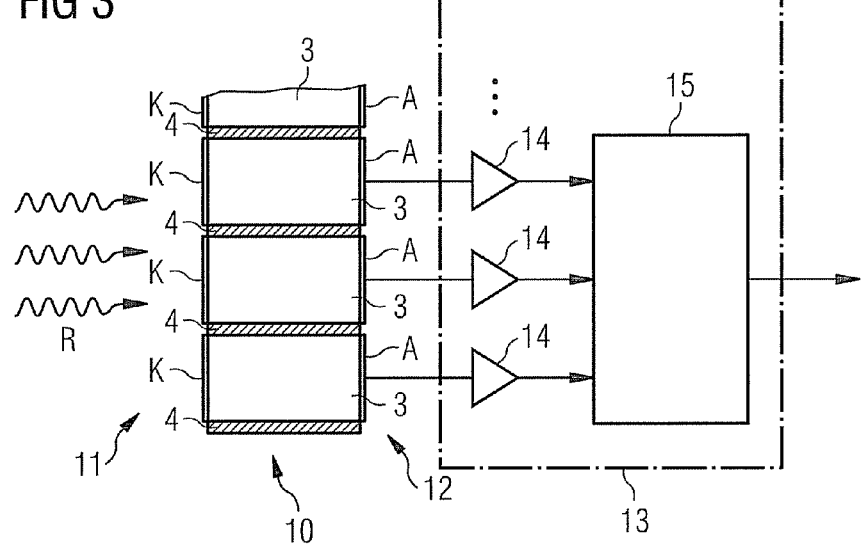
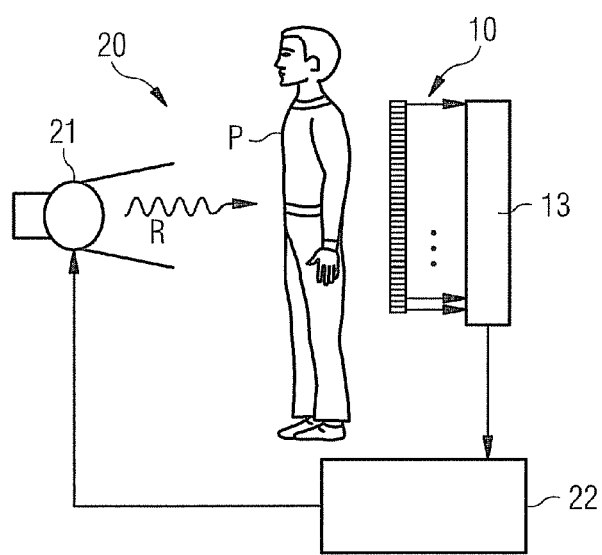

DIRECT RADIATION CONVERTER, RADIATION DETECTOR, MEDICAL APPARATUS AND METHOD FOR PRODUCING A DIRECT RADIATION CONVERTER

PRIORITY STATEMENT

The present application hereby claims priority under 35 U.S.C. §119 to German patent application number DE 10 2011 003 454.4 filed Feb. 1, 2011, the entire contents of which are hereby incorporated herein by reference.

FIELD

At least one embodiment of the invention generally relates to a direct radiation converter comprising a radiation detection material having an anode side and a cathode side that is different therefrom. At least one embodiment of the invention also generally relates to a radiation detector having such a direct radiation converter, to a medical apparatus having such a radiation detector, and/or to a method for producing a direct radiation converter.

BACKGROUND

Scintillation detectors or direct-converting detectors based on semiconductor materials are generally employed for detecting ionizing radiation, in particular gamma and X-ray radiation. In the scintillation detectors the incident radiation is detected indirectly by way of the excitation of electrons and their conversion into photons. The direct-converting detectors are different therefrom by virtue of their ability to count individual photons. By means of a special semiconductor material the direct-converting detectors are able to count individual photons and consequently can directly identify the radiation.

Existing direct radiation converters are based on semiconductor materials such as CdTe, CdZnTe, CdZnSe and CdZnTeSe, for example. However, with said semiconductor materials, in particular when they are subjected to X-ray and/or gamma irradiation at high flux densities, as are typical or necessary for example in CT equipment, a space-charge region is formed in the direct converter due to slow holes or stationary charges which are usually bound to deep or what are called intrinsic impurities. Said deep impurities (having a depth of up to half the bandgap energy) can capture the charge carriers generated through radiation and recombine with them. The space-charge region generated as a result as well as the reduction in the mobility of all the charge carriers cause a reduction in the externally applied electric field and consequently a reduction in the pulse height, with the result that a considerably lower intensity of radiation is suggested. In other words the spectrum is energetically shifted toward lower values. This effect is called polarization and it limits the maximum detectable flux of a direct-converting detector.

No method is known in the prior art for avoiding polarization under applicable ambient conditions in direct converters without additional structural measures. For example, the use of direct converters having a high hole mobility, such as germanium, is limited due to the low bandgap energy and the leakage current associated therewith. Moreover, germanium cannot be used as a direct radiation converter at room temperature, which means that detector systems of said type need to be cooled to well below 0° C. during application.

In another method an attempt is made to prevent the polarization by applying an external electric or radiation field. The aim of this method is to saturate the deep impurities and not to reduce the hole mobility. This is often carried out prior to the measurement, in which case an additional investment must be made in terms of procedural mechanisms and equipment.

SUMMARY

In at least one embodiment of the present invention the maximum detectable flux of a direct radiation converter is improved and in particular space-charge effects or polarization effects are reduced or avoided also when such direct radiation converters are deployed under normal conditions.

At least one embodiment is directed to a direct radiation converter, a radiation detector, a medical apparatus, and/or a method.

A direct radiation converter according to at least one embodiment of the invention includes a radiation detection material which has an anode side and a cathode side and in which the individual photons penetrating the material can be counted. By generating charge carriers in the direct-converting material it is possible to demonstrate the incident radiation directly via a count rate acquisition device.

A radiation detection material employed according to at least one embodiment of the invention has a doping profile running in the anode- to cathode-side direction. "Doping profile" in this context means that the doping component and/or the doping concentration vary or are different in the anode- to cathode-side direction. Also encompassed in this is that a doping or an additional doping may be present only on the anode side or only on the cathode side. By virtue of such a doping profile running from the anode side to the cathode side in direction, the direct converters according to the invention differ from the hitherto known converters, since in the latter direct-converting materials having a uniform or homogeneous doping over the entire extent of material between cathode and anode are used for either n-type or p-type conduction. In other words it is possible by means of the invention to adjust the Fermi level on the cathode side and/or the anode side more effectively by means of a corresponding additional doping.

The doping profile in this case enables the direct-converting material to be adapted in such a way that it is possible to obtain a high hole mobility on the cathode side or a high electron mobility on the anode side or a corresponding adjustment of the charge carrier mobility on both sides. As a result, given a corresponding adjustment of the doping profile from the anode to the cathode, a collapse of the externally applied electric field can be counteracted at the point at which space-charge regions are produced due to the above-described effects of the radiation-induced space charges. Expressed in other terms, such a doping profile enables different mobilities of charge carriers, such as e.g. holes and electrons, in the direct-converting material on the anode and cathode side, respectively. According to at least one embodiment of the invention the charge carrier transport can be optimized by adjusting the doping profile in relation to the space-charge regions typically resulting according to the material used. In particular the charge carrier transport can be set differently in the region of the anode and in the region of the cathode.

These and other advantages of the direct radiation converters according to at least one embodiment of the invention make them suitable for use in radiation detectors and in particular in detectors for count rate acquisition for X-ray and/or gamma irradiation. For this reason at least one embodiment of the invention is also directed toward a radiation detector comprising an inventive direct radiation converter, an anode array and a cathode array. Optionally the radiation detector can also have evaluation electronics for reading out a detector signal which e.g. can be embodied directly as part of the radiation detector. Alternatively the evaluation electronics can also be implemented as a separate system which can be connected to the radiation detector.

By reason of the above-explained advantages and in particular owing to the improvement in the space-charge effects or polarization effects the radiation detectors according to at least one embodiment of the invention are suitable also under normal operating conditions for use in medical equipment and in particular in devices having count rate acquisition under X-ray and/or gamma irradiation.

Accordingly at least one embodiment of the invention is also directed toward a medical apparatus having an inventive radiation detector. Particularly preferred examples thereof are X-ray systems, gamma ray systems, PET systems, CT systems or SPECT systems.

According to at least one embodiment of the invention the direct radiation converters are produced by means of a method which comprises at least the step of incorporating a doping profile into a radiation detection material in the direction running from the anode side to the cathode side. In the step of incorporating a doping profile into the material the doping component and/or the doping concentration can for example be varied from the anode side in the direction of the cathode side. Also included in this step is that a doping or an additional doping can be incorporated into the material only from the anode side or only from the cathode side. As a result of the incorporation or implementation of a doping profile the direct converters produced therefrom are different from the known prior art converters which merely have a uniform doping over the entire extent of material from the anode to the cathode.

The dependent claims and the following description contain particularly advantageous embodiments and developments of at least one embodiment of the invention, with attention being explicitly drawn to the fact that at least one embodiment of the inventive radiation detector and/or the inventive method can also be developed in accordance with the dependent claims to form the direct radiation converter, and vice versa.

In a first embodiment variant the direct radiation converter according to at least one embodiment of the invention has a radiation detection material which is doped on one side only. It differs from conventional converters having homogeneous doping in that as a result of the doping profile being incorporated on one side these have an increased charge carrier mobility either on the anode side or on the cathode side.

If such a one-sided doping is implemented on the cathode side, it is advantageous to dope the cathode side with additional doping agents such that the direct radiation converter has a doping profile having increased p-type conduction on the cathode side. The reason for this is that during the irradiation of the cathode side a positive space charge develops in homogeneously doped, direct-converting materials on this side due to slow holes and a relatively large capture cross-section of defects for holes. Said positive space charge counteracts the externally applied electric field. As a result of incorporating additional doping agents, i.e. acceptors, on the cathode side in a direct radiation converter according to the invention there are already holes which occupy the deep impurities present in the material. Charge carriers generated during the irradiation, typically holes on the cathode side, can consequently no longer be trapped or captured. As a result it is also possible only for a reduced space charge or no space charge to form thereafter. This means that the shallow acceptor levels (e.g. in the range of approx. 50-60 meV) of the doping agents implemented in the material on the cathode side can henceforth only effect a transitory trapping of the holes generated as a result of the irradiation.

In the direct radiation converters according to at least one embodiment of the invention said brief trapping of the holes lies in the nano- or microsecond range (nsec to μsec), with the result that the hole transport is significantly improved compared with the homogeneously doped materials. The count rate acquisition is accordingly no longer so severely impaired due to the reduced or absent additional space charge. Thus, even with energy-rich types of radiation such as X-ray or gamma irradiation having more than 5e8 photons/ $mm^2 \cdot sec$ (=$5 \cdot 10^8$ photons/$mm^2 \cdot sec$), for example, an improved count rate acquisition is possible by way of the inventive direct radiation converters having a doping profile in particular on the cathode side.

Generally a doping profile corresponding to the profile of the holes generated during the irradiation is beneficial on the cathode side so that said holes do not run the risk of becoming trapped due to their low mobility and short lifetime.

If a one-sided doping is implemented on the anode side, it is advantageous to dope the anode side with additional doping agents such that the direct radiation converter has a doping profile with increased n-type conduction on the anode side. Distortion of the electron signal can occur on the anode side due to the trapping of electrons generated during the irradiation. Because of the essentially high electron drift velocity the effect of even a short-lived trapping or capture of electrons at defects in the region of several dozen nanoseconds (nsec) is that the electrons can no longer be included in the pulse caused by the radiation quantum. According to the invention deep impurities present on the anode side in a homogeneously doped, direct-converting material are replaced by very shallow donors. Advantageous in particular are such shallow donors which possess no localized states at room temperature, i.e. which are located less than approx. 26 meV below the conduction band of the direct converter. Delay to pulses is prevented as a result, and at the same time no negative space charge can develop due to trapped electrons. Short pulse durations in turn enable high radiation flux densities to be detected, since no disruptive pulse overlays occur.

As an alternative to the two above-cited alternatives of the first embodiment variant, i.e. the implementation of a one-sided additional doping either on the cathode side or on the anode side, it is equally possible according to the invention to generate the doping profile over the entire range between the anode and the cathode. For example, an additional doping that is the same for both sides or is different can be implemented both on the anode side and on the cathode side or in the entire region between anode and cathode. Such an inventive direct radiation converter according to the second embodiment variant beneficially comprises a radiation detection material which is doped on the cathode side with additional doping agents such that it has a doping profile having increased p-type conduction on the cathode side and is doped on the anode side with additional doping agents such that it has a doping profile having increased n-type conduction on the anode side.

By way of such a doping profile the above-cited advantages in respect of the prevention of space charges and in particular a prevention of the trapping of holes on the cathode side and of electrons on the anode side can be combined.

In such an embodiment variant the Fermi level on the cathode side can be reduced somewhat as a result of the additional doping, while it can be increased somewhat on the anode side by means of a corresponding additional doping. As a result the hole transport characteristics are improved on the cathode side at the expense of the electron transport, while the transport characteristics of the electrons are improved on the anode side. As explained in detail hereinbefore, on the one hand no more space charges can build up in the region of highest hole density, i.e. on the cathode side. On the other hand, in the region of the signal shaping in immediate proximity to the anode, i.e. the region of highest electron density, narrow pulses can be generated owing to a high mobility of the electrons and the buildup of a negative space-charge region can be prevented.

In an example embodiment variant of the direct radiation converter according to the invention, the radiation detection material is produced from a semiconductor compound based on a uniform base conduction, in particular p-type conduction or n-type conduction. A doping profile is implemented thereon by means of additional doping on the anode side, on the cathode side, on both sides, or over the entire region between anode and cathode. The doping profile is in this case preferably embodied in such a way and adapted to the type of radiation and the direct-converting material as has been explained in relation to the first and second embodiment variant.

There are different possibilities for the embodiment or shape of the profile along the direction between anode side and cathode side. In an example embodiment the doping profile changes from the anode side toward the cathode side at least in sections essentially continuously or steadily, particularly preferably essentially linearly, exponentially or sigmoidally. Alternatively or in addition the doping profile may also have discontinuities from the anode side toward the cathode side. The precise variational shape is dependent inter alia on the method with which the doping profile is generated.

If the doping profile is developed starting from one side, it can drop away, in particular for example linearly or exponentially, from the cathode or anode toward the interior of the converter. If the doping profile extends from the anode side to the cathode side, that is to say over the entire width of the direct-converting material, it is possible for it also to extend linearly, exponentially or sigmoidally from one side to the other. It is also possible for the profile to vary linearly, exponentially or sigmoidally starting from the cathode and the anode side in each case and as it were for two profiles of an anode-side and cathode-side doping to overlay one another or join together to form an overall doping profile. In this case a doping profile therefore develops for example with a sink in a central region of the direct radiation converter between anode side and cathode side.

Any materials and in particular semiconductor compounds having direct-converting properties can be used as radiation detection material. Examples of direct-converting semiconductor compounds that can be used in the radiation converters according to the invention are II-VI or III-V semiconductor compounds, in particular selenides, tellurides, antimonides, nitrides, arsenides and phosphides, such as material systems based on CdSe, CdZnTe, CdTeSe, CdZnTeSe, CdMnTeSe, GaSb, GaInSb, GaInAsSb, GaInPSb, AlInSb, AlInAsSb, GaN, GaInN, GaAsN, GaInAsN and InP, for example. The ternary and quaternary material systems are preferably semiconductor compounds of the compound type $Cd_xZn_{1-x}Te$ (where $0 \leq x \leq 1$), $Cd_xZn_{1-x}Te_ySe_{1-y}$ (where $0 \leq x \leq 1$; $0 \leq y \leq 1$) or $Cd_xMn_{1-x}Te_ySe_{1-y}$ (where $0 \leq x \leq 1$; $0 \leq y \leq 1$), $Ga_xIn_{1-x}Sb_yAs_{1-y}$ (where $0 \leq x \leq 1$; $0 \leq y \leq 1$), $Ga_xIn_{1-x}Sb_yP_{1-y}$ (where $0 \leq x \leq 1$; $0 \leq y \leq 1$), $Al_xIn_{1-x}Sb_yAs_{1-y}$ (where $0 \leq x \leq 1$; $0 \leq y \leq 1$), $Al_xIn_{1-x}Sb_yP_{1-y}$ (where $0 \leq x \leq 1$; $0 \leq y \leq 1$), $Ga_xIn_{1-x}Sb_yN_{1-y}$ (where $0 \leq x \leq 1$; $0 \leq y \leq 1$) or $Ga_xIn_{1-x}N_yP_{1-y}$ (where $0 \leq x \leq 1$; $0 \leq y \leq 1$). The remaining ternary or quaternary semiconductor compounds are analogously structured hybrid compounds, and their basic structure is well-known to persons skilled in the art. When reference is made to a group from the periodic table of the elements, the invention basically relates to the main groups of the periodic table, subgroup elements, in contrast, being explicitly identified as subgroups.

In order to produce at least one embodiment of an inventive direct radiation converter having a doping profile, the aforementioned radiation detection materials can be doped with dopants or doping agents on the cathode side, on the anode side or over the entire width between anode and cathode.

Examples of example doping agents which can be used on the cathode side are such doping agents which generate shallow acceptor levels in the aforementioned radiation detection materials. In material systems having II-VI semiconductor compounds, elements from group I or group V of the periodic table of elements or a mixture of said elements, and in particular Li, Na, K, Rb, Cs (group I) or N, P, As, Sb, Bi (group V), can be used for this purpose on the cathode side.

For material systems having III-V semiconductor compounds, elements from group II, group IV or a subgroup of the periodic table of elements or a mixture of said elements are suitable on the cathode side. For example, Be, Mg, Zn, Cd, Hg and in particular Be (group II) or C, Si, Ge, Sn, Pb (group IV) or Zn, Cd, Hg, Cr, V, Ti (subgroups) can be used in order to achieve the aforementioned advantages.

In material systems having II-VI semiconductor compounds, elements from group III or group VII of the periodic table of elements or a mixture of said elements, and in particular B, Al, Ga, In, Tl (group III) or F, Cl, Br, I (group VII), can be used for this purpose on the anode side.

For material systems having III-V semiconductor compounds, elements from group VI or group IV of the periodic table of elements or a mixture of said elements, and in particular O, S, Se, Te (group VI) or C, Si, Ge, Sn, Pb (group IV), are suitable on the anode side in order to achieve at least one of the aforementioned advantages of the direct converter with doping profile. In this case counter-doping can occur if the element from group V is not installed onto the lattice site of the element from group III. This should be taken into account during the production of the direct-converting material. Suitable means for this are known to persons skilled in the art.

Preferably the radiation detection material on the cathode side is doped with additional doping agents, as listed hereinbefore, in such a way that it has a doping profile having increased p-type conduction on the cathode side, and the radiation detection material on the anode side is doped with additional doping agents, as listed hereinbefore, in such a way that it has a doping profile having increased n-type conduction on the anode side.

The doping concentrations that are beneficial for this are coordinated with the respective radiation detection materials so that the aforementioned general doping profile is achieved. In certain preferred embodiment variants, in particular in the case of material systems based on $Cd_xZn_{1-x}Te_ySe_{1-y}$ (where $0 \leq x \leq 1$; $0 \leq y \leq 1$) or $Cd_xMn_{1-x}Te_ySe_{1-y}$ (where $0 \leq x \leq 1$; $0 \leq y \leq 1$), the concentration of dopants from group VII (F, Cl, Br, I) is in each case or, in the case of mixed use, adds up in total to approximately $1e14$ atoms/cm$^3$ to $1e19$ atoms/cm$^3$, preferably between $1e16$ atoms/cm$^3$ and $5e18$ atoms/cm$^3$, and further preferably between $1e17$ atoms/cm$^3$ and $1e18$ atoms/cm$^3$. The concentration of dopants from group III (B, Al, Ga, In, Tl) and from group I (Li, Na, K, Rb, Cs) or V (N, P, As, Sb, Bi) can preferably lie in each case or, in the case of mixed use, adds up in total to approximately $1e14$ atoms/cm$^3$ to $1e19$ atoms/cm$^3$, preferably between $1e16$ atoms/cm$^3$ and $1e18$ atoms/cm$^3$, and further preferably between $3e16$ atoms/cm$^3$ and $3e17$ atoms/cm$^3$.

Similar doping concentrations can be used in the III-V material systems provided the respective concentrations are sufficient to reduce the Fermi level on the cathode side and increase it on the anode side.

In an example embodiment variant, in particular based on III-V compounds, such as $Ga_xIn_{1-x}Sb_yAs_{1-y}$ (where $0 \leq x \leq 1$; $0 \leq y \leq 1$), $Ga_xIn_{1-x}Sb_yP_{1-y}$ (where $0 \leq x \leq 1$; $0 \leq y \leq 1$), $Al_xIn_{1-x}Sb_yAs_{1-y}$ (where $0 \leq x \leq 1$; $0 \leq y \leq 1$), $Al_xIn_{1-x}Sb_yP_{1-y}$ (where $0 \leq x \leq 1$; $0 \leq y \leq 1$), $Ga_xIn_{1-x}Sb_yN_{1-y}$ (where $0 \leq x \leq 1$; $0 \leq y \leq 1$), $Ga_xIn_{1-x}N_yP_{1-y}$ (where $0 \leq x \leq 1$; $0 \leq y \leq 1$), the concentration of dopants from group VI (O, S, Se, Te) is in each case or, in the case of mixed use, adds up in total to approximately 1e14 atoms/cm$^3$ to 1e19 atoms/cm$^3$, preferably between 3e15 atoms/cm$^3$ and 3e18 atoms/cm$^3$, and further preferably between 1e16 atoms/cm$^3$ and 3e17 atoms/cm$^3$. The concentration of dopants from group IV (C, Si, Ge, Sn, Pb) and from group II (Be, Mg, Ca, Sr, Ba), elements from the subgroups (e.g. Cr, V, Ti, Zn, Cd, Hg) can preferably be in each case or, in the case of mixed use, add up in total to approximately 1e14 atoms/cm$^3$ to 1e19 atoms/cm$^3$, 3e15 atoms/cm$^3$ to 3e18 atoms/cm$^3$, and further preferably to 1e16 atoms/cm$^3$ to 3e17 atoms/cm$^3$.

An example preferred embodiment variant of the radiation detector according to the invention comprises one of the direct radiation converters with doping profile explained in detail hereinbefore and an anode array, a cathode array and optionally evaluation electronics for reading out a detector signal.

Detectors according to at least one embodiment of the invention can be implemented as Schottky detectors or as ohmic detectors. With a Schottky detector, a transition from the semiconductor to the metal (electrode) takes place in one direction only, i.e. such a detector blocks in one direction. With an ohmic detector, the electrons can flow in both directions, i.e. from the semiconductor into the metal and vice versa. An ohmic detector therefore does not have said blocking effect like a Schottky detector.

Such a radiation detector can be implemented as a singular element or as a combined element consisting of two or more individual detectors. A plurality of detectors are usually also referred to as a detector array, which is often constructed from an individual semiconductor base element which has been provided with septa as insulating blocking elements and electrodes. In such a detector array the irradiation is preferably incident from the side of the cathode which has been applied or vapor-deposited onto the semiconductor base element. In a singular detector element the irradiation direction is essentially independent of the embodiment of the electrodes and can also run laterally or likewise from the cathode side or the anode side.

By virtue of their improved performance in terms of charge carrier mobility through the prevention of space-charge effects and polarization the detectors according to at least one embodiment of the invention are suitable for use in a medical apparatus using X-ray and/or gamma radiation having high flux densities. Such a medical apparatus according to at least one embodiment of the invention accordingly comprises a radiation detector as explained in detail hereinbefore and an X-ray system, a gamma ray system, a PET system, a CT system or a SPECT system.

In such devices it is possible to measure high radiant fluxes, as occur in particular in computed tomography, owing to the avoidance or reduction of the polarization in the direct radiation converters. Accordingly a good energy resolution at high radiant fluxes can also be achieved at ambient temperature without great investment in extra equipment. A further advantage of the use of direct radiation converters having a doping profile according to the invention lies in the fact that shorter pulse durations than in the case of conventional devices are possible inter alia as a result of the avoidance of charge carrier cloud dispersion at deep impurities.

The radiation detection materials with doping profile used in the direct radiation converters according to at least one embodiment of the invention can generally be produced by way of a method which includes the step of incorporating a doping profile into a radiation detection material in the anode-to cathode-side direction.

In an example embodiment variant the doping profile is incorporated by indiffusion of doping agents or by a subsequent ion implantation of doping agents into the radiation detection material either from the cathode side, from the anode side or from both sides. Currently established methods for diffusing doping agents into radiation detection materials are known to persons skilled in the art. In particular they are familiar both with the circumstances in relation to equipment and with the process parameters to be used for the respective material, such as temperature, pressure, doping concentration, etc.

Example method processes are thermal indiffusion from outside, in particular from the anode side or cathode side, or ion implantation. One reason for this is that indiffusion and implantation of dopants are tried-and-tested methods that have been applied for decades in the semiconductor industry. Ion implantation is preferred for doping III-V semiconductor compounds, since radiation damage can be provoked in II-VI semiconductor compounds which sometimes causes degradation of the structural and electrical properties and cannot be compensated for by means of an aftertreatment ("post processing") such as annealing.

In an alternative embodiment variant the doping profile can be produced by applying or growing a higher- or lower-doped layer, according to the desired doping profile, onto a base layer consisting of a radiation detection material. Here, too, currently popular methods for applying or growing layer structures are known to persons skilled in the art. They are familiar both with the circumstances in relation to equipment and with the process parameters to be used for the respective material, such as temperature, pressure, doping concentration, etc. Preferred method processes are a transport growth method, such as e.g. physical vapor transport, chemical gas phase deposition, chemical gas phase epitaxy and molecular beam epitaxy. In such transport growth methods the desired doping concentration can be set during the growth process. If the layer thicknesses permit, it is also conceivable to produce a layer with doping profile separately and to apply said layer onto a base layer consisting of a radiation detection material.

BRIEF DESCRIPTION OF THE DRAWINGS

The invention is explained in more detail below with reference to example embodiments taken in conjunction with the attached drawings. The drawings are therefore intended to serve simply to illustrate the invention, but the invention is not to be limited thereto. In the drawings:

FIG. 3 shows an example embodiment of a radiation detector according to the invention, and FIG. 4 shows an example embodiment of a medical apparatus according to the invention.

Figure 1:
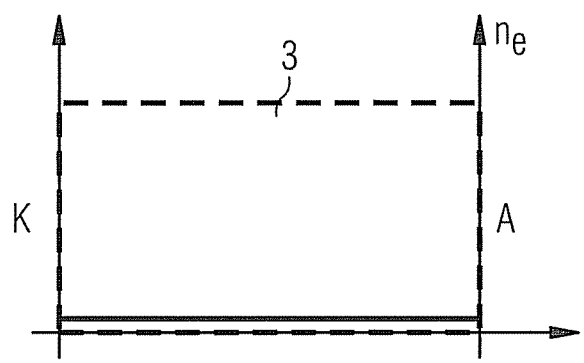
FIG. 1 is a schematic representation of the electron concentration ne between cathode (K) and anode (A) of a conventional direct radiation converter with n-type conduction.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 is a schematic showing the electron concentration $n_e$ of a conventional n-doped direct radiation converter 6. As can be seen from FIG. 1, a homogeneous distribution 60 of the electron concentration $n_e$ is present in n-doped semiconductor materials in the region between the cathode (K) and the anode (A). In a II-VI material system this can be achieved for example by means of dopants from group III or VII. Very small electron excesses, but also hole excesses, are typical. The majority charge carrier type in a semi-insulating semiconductor is determined by the interaction of the incorporated doping agents and the intrinsic doping due to inherent defects such as impurities or so-called antisites, atoms occupying the "wrong" lattice site.

Figure 2:
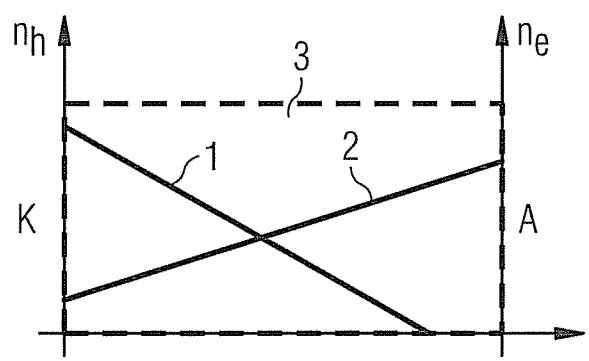
FIG. 2 is a schematic representation of the hole concentration nh (1) and electron concentration ne (2) between cathode (K) and anode (A) of an inventive direct radiation converter with doping profile.

According to an embodiment of the invention an additional doping profile can be implemented over such a homogeneous distribution of electrons. An example is shown in FIG. 2, wherein the hole concentration $n_h$ (curve 1) is indicated on the left (cathode side) and the electron concentration $n_e$ (curve 2) on the right (anode side). On the cathode side (K) this is achieved in the case of the II-VI material system shown in FIG. 2 by incorporating dopants from group I or V. In this case the result is a hole excess (high hole concentration $n_h$ (curve 1)) on the cathode side which decreases linearly from the cathode side toward the interior of the converter 3. On the anode side (A) dopants from group III or VII are used to generate an excess of electrons. In the case schematically illustrated here the electron concentration ne (curve 2) decreases linearly from the anode side toward the interior of the converter 3. According to the invention the decline in electron excess or hole excess may not only be embodied linearly, but for example as indicated by curves 1A, 2A can also decrease exponentially or sigmoidally or optionally also increase or change variably. Equally it is possible for the doping profile to vary in a stepwise manner or continuously in sections with intermediate steps therebetween.

The above-described doping profile shows an additional doping with acceptors (holes) on the cathode side, which leads to a lesser trapping of the holes during irradiation, even when count rate acquisition is performed under X-ray or gamma irradiation. The increased p-type conduction on the cathode side reduces or prevents the formation of a positive space charge, with the result that no polarization occurs in the direct radiation converter according to the invention.

On the anode side donors have been incorporated as dopants which reduce or prevent the trapping of electrons and consequently to a large extent also prevent polarization due to space-charge effects during the irradiation in particular with X-rays or gamma rays.

Space-charge effects and polarization effects can be reduced or avoided also under normal operating conditions such as room temperature through the incorporation of a doping profile into a direct radiation converter in the cathode-to-anode direction.

FIG. 3 shows an example embodiment of an inventive radiation detector 10 which in this case is equipped with evaluation electronics 13. In order to implement the detector, direct radiation converters 3 provided according to the invention with a doping profile are in this case disposed next to one another in a matrix-like arrangement (only a detail of one row of said detector is shown in FIG. 3) and separated from one another by septa 4. The radiation detector 10 has a cathode array 11 and an anode array 12, such that each direct radiation converter 3 is provided with a cathode K on a cathode side and an anode A on an anode side. The ionizing radiation that is to be detected, e.g. X-ray radiation R, is incident here on the cathode side of the radiation detector 10. In principle, however, a radiation detector according to the invention may also be implemented in such a way that the radiation R that is to be detected strikes the radiation detector from a different direction of incidence, for example that the radiation detector is aligned in such a way that the cathode side and the anode side are situated in parallel with the direction of incidence.

The radiation detector 10 is in this case provided with evaluation electronics 13 having a preamplifier 14 for each direct radiation converter 3 in order first to preamplify a signal produced in said direct radiation converter 3. The coupling of the preamplifiers 14 to the anodes A is shown in greatly simplified form in the figure. The basic methods enabling signals to be read out and processed further by a radiation detector are known to persons skilled in the art. The preamplifiers 14 are connected to a signal processing device 15 in which the signals are processed further and then e.g. passed on to an evaluation unit (not shown).

FIG. 4 shows a very simple example embodiment of a medical apparatus 20, in this case an X-ray system 20. This has an X-ray tube assembly 21, an inventive radiation detector 10 having evaluation electronics 13, and a system control device 22. During operation the X-ray tube assembly 21 and the radiation detector 10 are arranged opposite one another such that the beam emission direction of the X-ray tube assembly 21 points toward the radiation detector 10. For the purpose of recording an X-ray image, an examination subject P, for example a patient or a part of the patient's body, is then suitably positioned between the X-ray tube assembly 21 and the radiation detector 10 in order to detect in a spatially resolved manner by means of the radiation detector 10 the X-ray radiation R emitted by the X-ray tube assembly 21 and attenuated by the examination subject P. The X-ray tube assembly 21 is controlled in this arrangement by means of a system control device 22, represented in greatly simplified form, which also accepts the detector signals processed by the evaluation electronics 13 for further processing in order, for example, to reconstruct an image from the detector signals and output said image to a user or store it in a memory.

Finally it is pointed out once again that the direct radiation converters, radiation detectors and method for their production described in detail in the foregoing are simply preferred exemplary embodiments which can be modified in various ways by persons skilled in the art without departing from the scope of the invention, insofar as said scope is circumscribed by the claims. In particular the same or at least similar effects can be achieved if the doping profile is inserted on one side only, either the anode or the cathode side, of such a direct converter. Thus, for example, a similar electron concentration to that shown in FIG. 2 can be set on the anode side, though without increasing the hole concentration on the cathode side. An inventive direct converter with a doping profile and enhanced performance is obtained in this case too. The same applies if just the hole concentration is set in the doping profile analogously to FIG. 2, yet the electron excess on the anode side is not changed relative to a homogeneous base conduction.

For completeness it is also pointed out that the use of the indefinite article "a" or "an" does not rule out the possibility of the relevant features also being present more than once. Equally the term "element" to describe a structural part does not preclude the latter consisting of a plurality of components which in certain circumstances may also be spatially distributed.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A direct radiation converter comprising: a radiation detection material including an anode side and a cathode side, wherein the radiation detection material includes incorporated doping agents and has a doping profile running in the anode-side to cathode-side direction, wherein at least one of a dopant concentration and a doping component only varies substantially continuously from at least one of the anode side and the cathode side to the other of the anode side and the cathode side.

2. The direct radiation converter as claimed in claim 1, wherein the radiation detection material includes additional doping agents on the cathode side such that the doping profile comprises an increased p-type conduction on the cathode side.

3. The direct radiation converter as claimed in claim 1, wherein the radiation detection material includes additional doping agents on the anode side such that the doping profile comprises increased n-type conduction on the anode side.

4. The direct radiation converter as claimed in claim 1, wherein the radiation detection material is constructed from a semiconductor compound on the basis of a homogeneous base conduction and the doping profile is implemented thereon by way of additional doping on at least one of the anode side and the cathode side.

5. The direct radiation converter as claimed in claim 1, wherein the doping profile varies from the anode side toward the cathode side at least in sections essentially continuously.

6. The direct radiation converter as claimed in claim 1, wherein the doping profile has discontinuities from the anode side toward the cathode side.

7. The direct radiation converter as claimed in claim 1, wherein the radiation detection material includes semiconductor compounds.

8. The direct radiation converter as claimed in claim 1, wherein the radiation detection material is constructed from II-VI semiconductor compounds and the doping agents for the II-VI semiconductor compounds are elements from group I or group V or a mixture thereof; or elements from group VII or group III or a mixture thereof.

9. The direct radiation converter as claimed in claim 1, wherein the radiation detection material is constructed from III-V semiconductor compounds and the doping agents for III-V semiconductor compounds are elements from group II, group IV, subgroups thereof or a mixture thereof; or elements from group IV or group VI or a mixture thereof.

10. A radiation detector comprising:
the direct radiation converter as claimed in claim 1;
an anode arrangement; and
a cathode arrangement.

11. A medical apparatus comprising the radiation detector as claimed in claim 10.

12. The medical apparatus as claimed in claim 11, further comprising an X-ray system, a gamma ray system, a PET system, a CT system or a SPECT system.

13. The radiation detector as claimed in claim 10, further comprising:
evaluation electronics that receives a detector signal produced in the direct radiation converter.

14. The direct radiation converter as claimed in claim 4, wherein the radiation detection material is constructed from a semiconductor compound on the basis of a p-type conduction or n-type conduction, and the doping profile is implemented thereon by way of additional doping on at least one of the anode side and the cathode side.

15. The direct radiation converter as claimed in claim 5, wherein the doping profile varies from the anode side toward the cathode side at least in sections essentially exponentially or sigmoidally.

16. The direct radiation converter as claimed in claim 7, wherein the radiation detection material includes semiconductor compounds selected from the group consisting of $Cd_xZn_{1-x}Te_ySe_{1-y}$ (where $0 \le x \le 1$; $0 \le y \le 1$) or $Cd_xMn_{1-x}Te_ySe_{1-y}$ (where $0 \le x \le 1$; $0 \le y \le 1$), $Ga_xIn_{1-x}Sb_yAs_{1-y}$ (where $0 \le x \le 1$; $0 \le y \le 1$), $Ga_xIn_{1-x}Sb_yP_{1-y}$ (where $0 \le x \le 1$; $0 \le y \le 1$), $Al_xIn_{1-x}Sb_yAs_{1-y}$ (where $0 \le x \le 1$; $0 \le y \le 1$), $Al_xIn_{1-x}Sb_yP_{1-y}$ (where $0 \le x \le 1$; $0 \le y \le 1$), $Ga_xIn_{1-x}Sb_yN_{1-y}$ (where $0 \le x \le 1$; $0 \le y \le 1$), $Ga_xIn_{1-x}N_yP_{1-y}$ (where $0 \le x \le 1$; $0 \le y \le 1$).

17. The direct radiation converter as claimed in claim 8, wherein the elements from group I or group V or a mixture of said elements are Li, Na, K, Rb, Cs or N, P, As, Sb, Bi, respectively, and wherein elements from group VII or group III or a mixture of said elements are F, Cl, Br, I or B, Al, Ga, In, Tl, respectively.

18. The direct radiation converter as claimed in claim 9, wherein the elements from group II, group IV, the subgroups or a mixture of said elements are Be, Mg or C, Si, Ge, Sn, Pb or Zn, Cd, Hg, Cr, V, Ti, respectively, and wherein elements from group IV or group VI or a mixture of said elements are C, Si, Ge, Sn, Pb or O, S, Se, Te, respectively.

* * * * *